United States Patent
Bonebright et al.

(10) Patent No.: US 9,853,599 B2
(45) Date of Patent: Dec. 26, 2017

(54) SIMULTANEOUS LINEARIZATION OF MULTIPLE POWER AMPLIFIERS WITH INDEPENDENT POWER

(71) Applicant: The Boeing Company, Chicago, IL (US)

(72) Inventors: Rodney K. Bonebright, Bellevue, WA (US); Brian K. Kormanyos, Edmonds, WA (US); Thomas H. Friddell, Kent, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 14/960,028

(22) Filed: Dec. 4, 2015

(65) Prior Publication Data

US 2017/0163217 A1 Jun. 8, 2017

(51) Int. Cl.
| | | |
|---|---|---|
| H04L 25/49 | (2006.01) | |
| H04L 27/00 | (2006.01) | |
| H03F 1/02 | (2006.01) | |
| H03F 3/193 | (2006.01) | |
| H03F 3/21 | (2006.01) | |
| H04B 1/04 | (2006.01) | |

(52) U.S. Cl.
CPC ........... *H03F 1/0211* (2013.01); *H03F 3/193* (2013.01); *H03F 3/211* (2013.01); *H04B 1/0475* (2013.01); *H03F 2200/451* (2013.01); *H03F 2203/21106* (2013.01); *H04B 2001/0425* (2013.01)

(58) Field of Classification Search
USPC ............... 375/219, 220, 221, 222, 240, 239, 375/240.26–240.27, 254, 259, 285, 284, 375/278, 295, 296, 297, 316, 318, 324, 375/346, 347, 344, 340, 354, 358
See application file for complete search history.

(56) References Cited

U.S. PATENT DOCUMENTS 4,839,905 A * 6/1989 Mantovani ........ H04L 25/03019
                                                         333/18
4,857,865 A   8/1989 Berman
(Continued)

OTHER PUBLICATIONS

Microwave power amplifier with "envelope controlled" drain power supply, C Buoli, A Abbiati, D Riccardi, Siemens Telecomunicazioni S.p.A. 20060-Cassina de'Pecchi, Italy, Fax 02 95259375, International Patent Application No. PCT/EP95/01698.
(Continued)

*Primary Examiner* — Linda Wong
(74) *Attorney, Agent, or Firm* — Miller, Matthias & Hull LLP

(57) ABSTRACT

An antenna array includes a plurality of power amplifiers, each having a signal input, a signal output coupled to a cell of the antenna array, and a power input. The antenna array includes a plurality of power supplies, each power supply individually and separately coupled to a corresponding one of the plurality of power amplifiers at a respective power input. The antenna array further includes single a pre-distortion linearizer with a linearizer input that receives a signal and a linearizer output that is coupled to each signal input of each of the plurality of power amplifiers. Each power amplifier is operated in gain compression by setting its operating voltage according to a power output of the power amplifier.

20 Claims, 6 Drawing Sheets

(56) References Cited

U.S. PATENT DOCUMENTS

| | | | | |
|---|---|---|---|---|
| 5,523,716 | A | 6/1996 | Grebliunas et al. | |
| 5,886,671 | A | 3/1999 | Riemer et al. | |
| 7,417,598 | B2 | 8/2008 | Navarro et al. | |
| 2003/0117215 | A1* | 6/2003 | O'Flaherty | H03F 1/0244 330/149 |
| 2004/0266470 | A1* | 12/2004 | Di Camillo | H04B 7/18515 455/522 |
| 2014/0184335 | A1* | 7/2014 | Nobbe | H03F 1/0227 330/291 |
| 2015/0080054 | A1* | 3/2015 | Kim | H03F 1/3247 455/561 |
| 2015/0103952 | A1* | 4/2015 | Wang | H04L 27/368 375/297 |
| 2015/0280795 | A1* | 10/2015 | Wimpenny | H03F 1/0222 375/267 |
| 2015/0372646 | A1* | 12/2015 | Briffa | H03F 1/025 330/297 |
| 2016/0036469 | A1* | 2/2016 | Karabinis | H04L 5/0007 375/260 |
| 2016/0079933 | A1* | 3/2016 | Fehri | H03F 1/3247 330/75 |
| 2016/0365906 | A1* | 12/2016 | Kusunoki | H04B 1/0475 |

OTHER PUBLICATIONS

IEEE Journal on Selected Areas in Communications, vol. SAC-1, No. 1, Jan. 1983, "Impact of a New TWTA Linearizer Upon QPSK/TDMA Transmission Performance", Gunkichi Satoh and Toshio Mizuno, Mmeber, IEEE.

"Efficiency Improvement Techniques at Low Power Levels for Linear CDMA and WCDMA Power Amplifiers", Thomas Fowler, Kerry Burger, Nai-Shuo Cheng, Apostolos Samelis, Ede Enobakhare, and Stephan Rohlfing, Conexant Systems, inc, 2427 West Hillcrest Dr., Newbury Park, CA, 91320 e-mail: thomas. fowler@conecant.com.

"A Digital Approach to Efficient RF Power Amplifier Linearization", Aldo N. D' Andrea, Vincenzo Lottici and Ruggero Reggiannini, Universita di Pisa, Dipartimento di ingegneria della Informazione, Via Diotisalvi n. 2, I-56126 Pisa, Italy.

\* cited by examiner

SIMULTANEOUS LINEARIZATION OF MULTIPLE POWER AMPLIFIERS WITH INDEPENDENT POWER

FIELD

This disclosure relates to phased array antenna systems and more particularly to linearization of signals in a phased array antenna.

BACKGROUND

A phased array antenna is used to broadcast a radio frequency (RF) signal with a particular radiation pattern using an antenna array with multiple antenna cells. Each antenna cell is driven by a dedicated power amplifier (PA) which can be operated at different power levels and phases to achieve the desired radiation pattern. Because each PA may be operated at a different power level, which affects distortion, a pre-distortion linearizer is coupled to each PA. The pre-distortion linearizers require a significant amount of space and add cost to the phased array antenna system.

SUMMARY

In an aspect of the disclosure, an antenna array includes a plurality of power amplifiers, each having a signal input, a signal output coupled to a respective antenna cell of the antenna array, and a power input. The antenna array includes a plurality of power supplies, each power supply individually and separately coupled to a corresponding one of the plurality of power amplifiers at a respective power input. The antenna array further includes a pre-distortion linearizer with a linearizer input that receives a signal and a linearizer output that is coupled to each signal input of each of the plurality of power amplifiers.

In another aspect of the disclosure, a method for simultaneous linearization of a plurality of power amplifiers with independently set operating voltages for a power amplifier includes selecting an operating voltage for each individual power amplifier of the plurality of power amplifiers where the operating voltage for each individual power amplifier selected to maintain each of the plurality of power amplifiers at a predetermined gain compression level. The method continues with independently setting the operating voltage for each individual power amplifier of the plurality of power amplifiers at the selected operating voltage and then routing a signal from a single pre-distortion linearizer to each of the plurality of power amplifiers.

In yet another aspect of the disclosure, an antenna array includes a first power amplifier of a plurality of power amplifiers, each of the power amplifiers including the first power amplifier having a signal input, a signal output, and a power input. The antenna array also includes a first power supply of a plurality of power supplies, each of the power supplies having a power output coupled to a respective power input of one of the plurality of power amplifiers, wherein a power output of the first power supply is set to operate the first power amplifier at a predetermined gain compression. The antenna array may also include a pre-distortion linearizer with a linearizer input and a linearizer output, the linearizer output coupled to each respective signal input of each of the plurality of power amplifiers. The antenna array also includes a plurality of antenna cells, each of the plurality of antenna cells coupled to a respective one signal output of each of the plurality of power amplifiers.

The features, functions, and advantages that have been discussed can be achieved independently in various embodiments or may be combined in yet other embodiments further details of which can be seen with reference to the following description and drawings.

BRIEF DESCRIPTION OF THE DRAWINGS

For a more complete understanding of the disclosed methods and apparatuses, reference should be made to the embodiment illustrated in greater detail on the accompanying drawings, wherein.

It should be understood that the drawings are not necessarily to scale and that the disclosed embodiments are sometimes illustrated diagrammatically and in partial views. In certain instances, details which are not necessary for an understanding of the disclosed methods and apparatuses or which render other details difficult to perceive may have been omitted. It should be understood, that this disclosure is not limited to the particular embodiments illustrated herein.

DETAILED DESCRIPTION

As discussed above, an antenna array has multiple individual antenna cells that can be operated at different power levels and phases to achieve a particular radiation pattern. An antenna array has multiple individual cells that each use a separate power amplifier to achieve a high signal quality at each antenna cell of the antenna array. A power amplifier (PA), particularly a linear power amplifier, is most efficient when operated in gain compression. However, all PAs have distortion (gain and phase), particularly when operated in gain compression. Distortion due to compression can be offset by a pre-distortion linearizer. In prior art antenna arrays with multiple power amplifiers operating at multiple power output levels, the distortion variations from PA to PA require that each PA have its own pre-distortion linearizer. In an antenna array where there can be, for example, a thousand or more PAs, this represents a significant cost. Further, in some high frequency applications where the antenna cells are placed as closely as ⅛ wavelength from each other, the space required to accommodate each separate pre-distortion linearizer can be problem.

PA distortion is a function of gain compression. Operating each PA at the same level of gain and phase compression allows the known distortion characteristics of each PA to be matched to each other. As a result, a single pre-distortion linearizer can be used in the signal path that drives each PA. In a circumstance where each PA operates at the same power output, operating each PA at the same level of compression is simply a matter of identical settings. How far a PA operates into compression is a function of signal input (or drive) level. However, the level of PA compression is also a function of operating voltage levels (gate and drain). When PAs are operated at different signal input levels, each PA can be operated at voltages that causes a particular input signal level to drive the PA into the same level of gain compression as other PAs even though the other PAs may be operating at a lower or higher power output.

Figure 1:
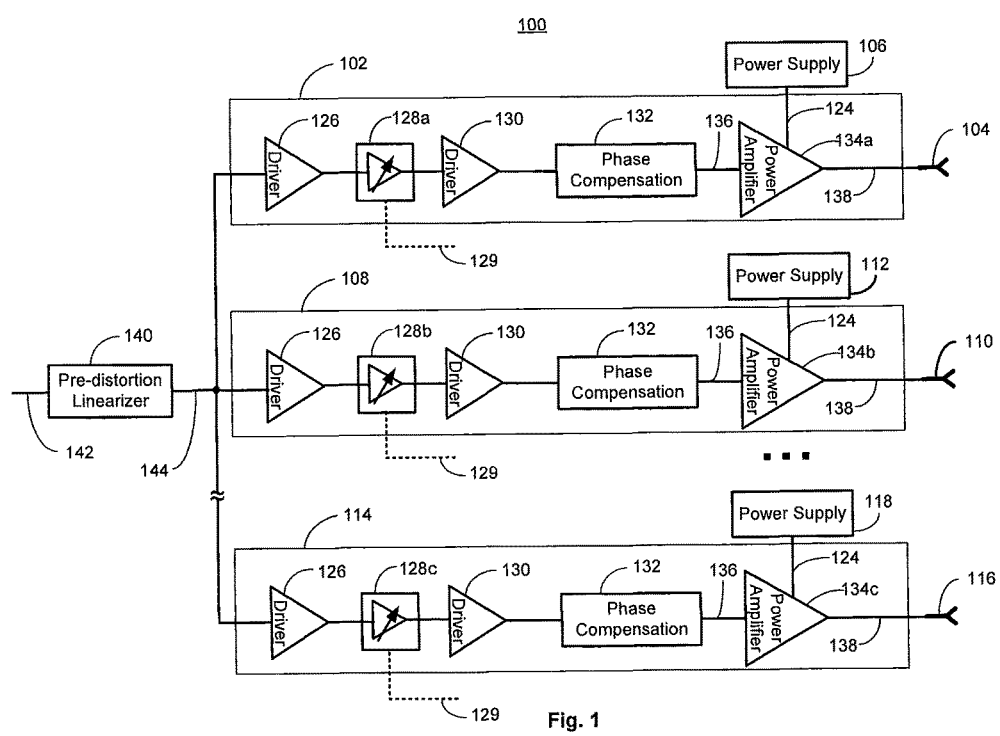
FIG. 1 is a block diagram of an antenna array in accordance with the current disclosure.

Before returning to the operation of such an antenna array, the configuration of an exemplary antenna array 100 in accordance with this disclosure is discussed with respect to FIG. 1. The antenna array 100 includes a plurality of power amplifier assemblies 102, 108, 114, a plurality of antenna cells 104, 110, 116 that radiate radio frequency energy, and a plurality of power supplies 106, 112, 118 each separately coupled to a respective one of the plurality of PA assemblies 102, 108, 114. Although three sets of power assembly, power supply, and antenna cell are illustrated, in other embodiments as few as two sets may be used or as many as thousands.

Each PA assembly 102, 108, 114, may include a driver 126 that provides impedance matching, signal amplification or both. A gain stage 128 may be used to provide a set level of signal amplification or may be capable of a variable level of signal amplification. In an embodiment, the gain stage 128 may be adjustable via a gain control 129. A second driver 130 may also be used for impedance matching and for any required signal adjustments such as additional gain or filtering. A phase compensator 132 may move the phase angle of the signal according to, among other things, a physical layout of the PA assembly 102. For example, a PA assembly 102 may be physically farther from the pre-distortion linearizer 140 than a PA assembly 114 so that each respective phase compensator is set so that the phase at the respective antenna cells 104 and 116 meets the desired radiation pattern.

Each PA assembly 102, 108, 114 also includes a power amplifier 134a, 134b, 134c with a signal input 136 coupled to the linearizer output 144, a signal output 138 coupled to a respective antenna cell 104, 110, 116 of the antenna array 100, and a power input 124 coupled to a respective power supply 106, 112, 118.

The antenna array 100 also includes a pre-distortion linearizer 140 with a linearizer input 142 that receives a signal from a signal source (not depicted) and a linearizer output 144. The pre-distortion linearizer 140 may be a digital pre-distortion linearizer or may be an analog pre-distortion linearizer. A pre-distortion linearizer 140 that is digital may allow real time generation of distortion profiles based on a state of the plurality of power amplifiers. For example, when transitioning from a high power output to a low power output a power amplifier 134a, 134b, 134c may exhibit a different distortion profile for the same power input level due to residual heat from sustained operation at the higher power level. Using a digital pre-distortion linearizer, this PA memory effect can be compensated for in real time based on a history of power output level. When the pre-distortion linearizer 140 is a digital pre-distortion linearizer, an additional element of control may be possible when part of a feedback loop. This embodiment is discussed more below with respect to FIG. 5.

Regarding the power supplies, each power supply 106, 112, 118 may be operated at a power output level that operates the PA 134a, 134b, 134c of its respective PA assembly 102, 108, 114 in gain compression even though the individual gain stages 128a, 128b, and 128c of each PA assembly may be set to different levels. Because the DC output of each power supply 106, 112, 118 is outside the signal path for a particular PA assembly 102, 108, 114, controlling PA power reduces or eliminates concerns about phase shift, impedance matching, and other non-linear effects that would be present if individual pre-distortion linearizers would be used. Further, the DC output of each power supply 106, 112, 118 is more easily protected from signal coupling and other spurious signals than the actual signal path. This allows the power supplies 106, 112, 118 to be located a relatively long distance from the antenna cells 104, 110, 116, increasing location options for installations where space, especially space near the antenna cells 104, 110, 116 is a premium.

The antenna array 100 may be operated in more than one mode that affects power supply selection. In an embodiment where the power output levels for each PA assembly are fixed, the power supplies 106, 112, 118 may be of any type as long as an output voltage can be set to the required value. In an embodiment where the antenna array can be set for different radiation profiles, the DC power output, that is, the DC voltage of the power supplies 106, 112, 118, may also need to be adjustable. In such an embodiment, the power supplies 106, 112, 118 may be a switching-regulated or switched voltage power supply so that the output voltage can be adjusted in real time.

Figure 2:
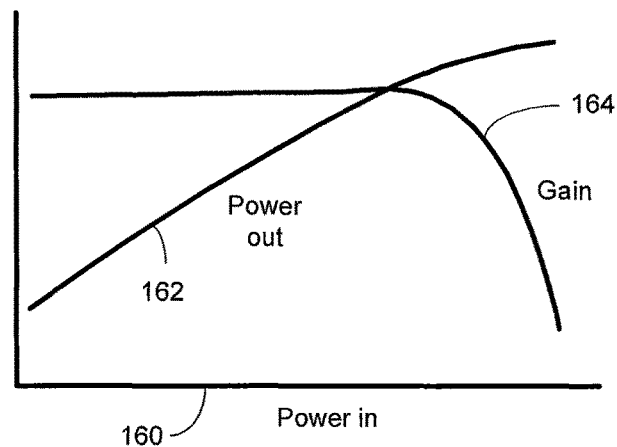
FIG. 2 is graph showing a signal power output curve and a gain curve for a power amplifier.
Figure 3:
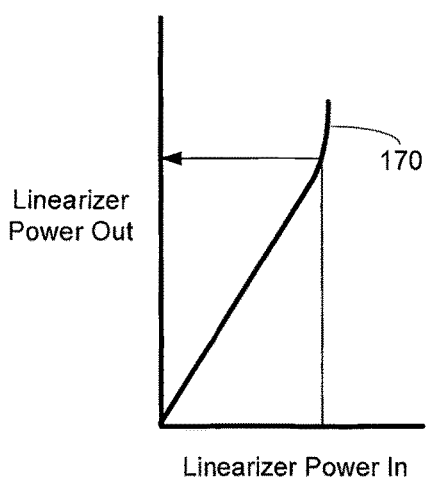
FIG. 3 is a graph showing a curve of output distortion for a power amplifier.
Figure 4:
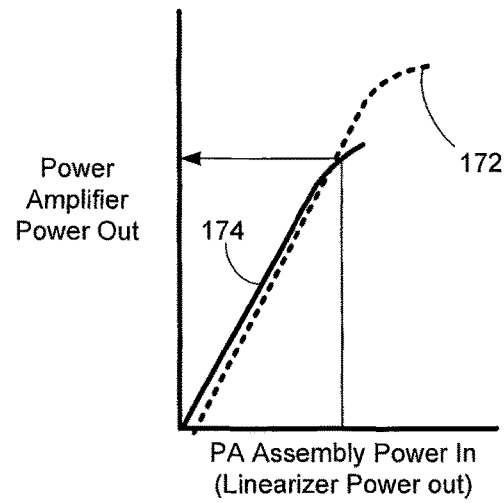
FIG. 4 a graph showing a curve of a transfer function for a pre-distortion linearizer.

FIGS. 2-4 illustrate characteristics of signal processing in accordance with the current disclosure. FIG. 2 shows a signal power output curve 162 and a gain curve 164 vs input signal power 160 for any of the power amplifiers 134a, 134b, 134c. As shown, as the input signal power increases, signal power output that starts out relatively linear flattens so that additional signal input power results in little increase in signal output power. Correspondingly, the gain 164 (power output/power in) decreases as input signal power increases into the flattened signal power output region. Compression is the state of the amplifier where the gain and phase are non-linear as signal power input is increased.

Turning to FIG. 3, the transfer function curve 170 for the pre-distortion linearizer 140 is shown. As can be seen, the transfer function curve 170 is such that as a PA, e.g., PA 134a is driven into gain compression and its power output is reduced, the pre-distortion linearizer 140 increases its power output to compensate for the drop off of the PA 134a in order to extend the overall linear region of operation well into the gain compression region of operation.

FIG. 4 illustrates an application of linearizing amplifiers. In the illustration, curve 172 illustrates that one power amplifier, e.g., PA 134a, is operating at a reduced power output relative to other power amplifiers 134b and 134c (not depicted in FIG. 4). If left alone, the PA 134a would be working within its linear region, well out of the efficient operating region of gain compression and away from a point where the pre-distortion linearizer 140 is operating to achieve linearization across all PAs 134a, 134b, 134c. In this exemplary embodiment, the power supply 106 may be adjusted down so that the PA 134a operates in gain compression, as illustrated by curve 174, so that its output will match the linearity of the other PAs 134b and 134c. In some embodiments, the gain function 128a may also be adjusted to keep the signal output of the PA 134a at the desired level. Thus, the desired linearization of output signals at antenna cells 104, 110 and 116 is accomplished using the single pre-distortion linearizer 140.

Figure 5:
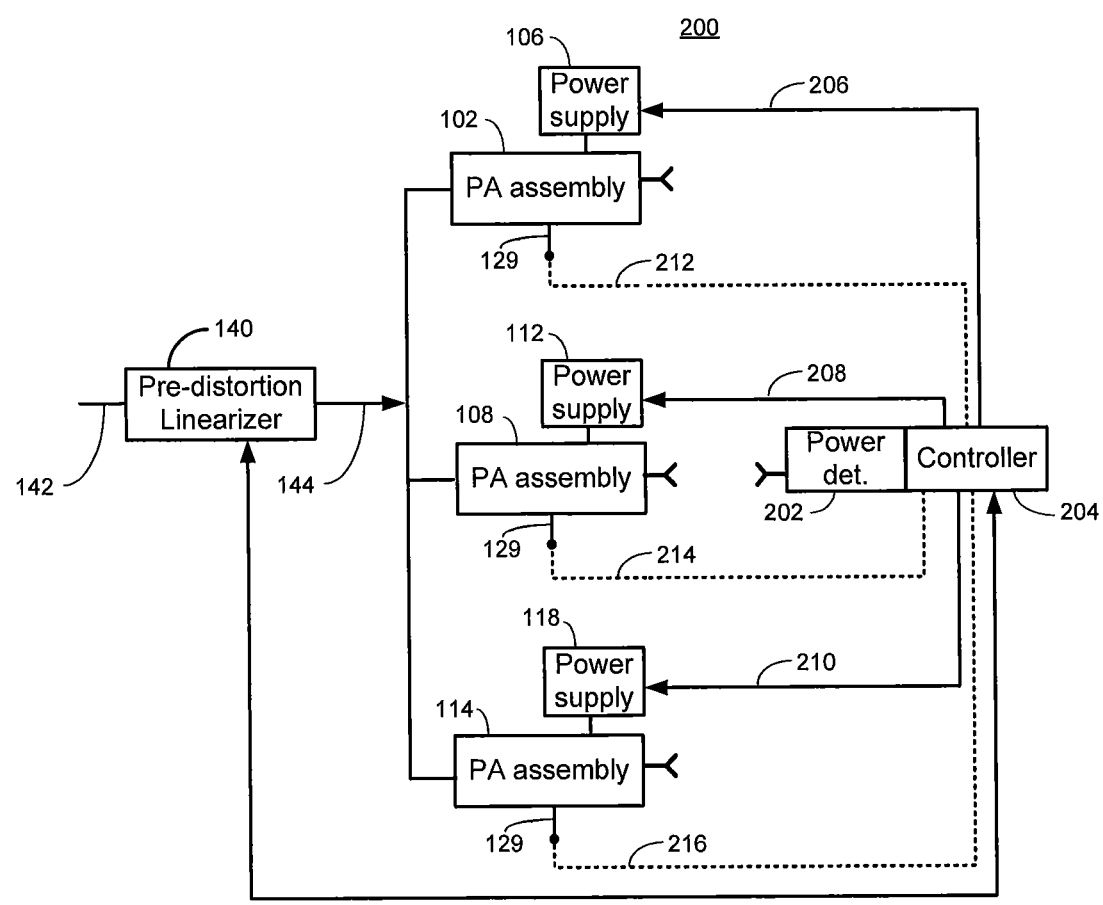
FIG. 5 is another block diagram of a different embodiment of an antenna array in accordance with the current disclosure.

FIG. 5 illustrates an embodiment of an antenna array 200 in accordance with the current disclosure. The antenna array 200 is configured for real time control for both memory effects and for adjustment of the radiation pattern while maintaining the respective power amplifier 134a, 134b, 134c (not shown in FIG. 5) of each PA assembly 102, 108, 114 at a known level of compression.

In this embodiment, a power detector 202, in the form of a receiver may be used to determine a signal output level of the antenna array 200. A controller 204 is able to control the output of the power supplies 106, 112, and 118 by respective control lines 206, 208, 210. The controller 204 is also able to set the gain value of gain stages 128a, 128b, and 128c, via control lines 212, 214, and 216 respectively. The controller may be programmed to analyze the output of the power detector 202 and characteristics of the pre-distortion linearizer 140, including the signal level at the input 142, the signal level at the output 144, the pre-distortion linearizer transfer curve, or combinations thereof to determine a steady or time-varying operating voltage profile of the antenna array 200. In an embodiment, an operating state may be low power operation after a period of high power operation, which is known to cause distortion related to residual heat in the power amplifiers 134a, 134b, 134c. In another embodiment, an operating state may be a desired change in a radiation pattern of the array 200.

In either of these embodiments, or others, the controller 204 may adjust each power supply 106, 112, 118 via respective control lines 206, 208, 210 to achieve a desired DC power output, or more specifically, to achieve a desired DC output voltage. For example, when the power detector 202 indicates the output power is uniformly reduced, the power supplies 106, 112, 118 may be set to change the operating voltage of their respective power amplifiers 134a, 134b, 134c to move the distortion curve 170 according to the known memory effect of the change to the reduced power level. In another example, a desire to change a radiation pattern may require that a gain level for a particular PA assembly, e.g., gain stage 128b of PA assembly 108, be reduced via control line 214, therefore the power supply 112 may have its voltage output reduced so that PA 134b operates in gain compression even though its power output is reduced. As discussed above, operating in gain compression has two effects, the first is operation at higher efficiency, the second is that operation at a known level of gain compression allows the single pre-distortion linearizer 140 to provide the correct pre-distortion signal to each PA assembly 102, 108, 114.

Figure 6:
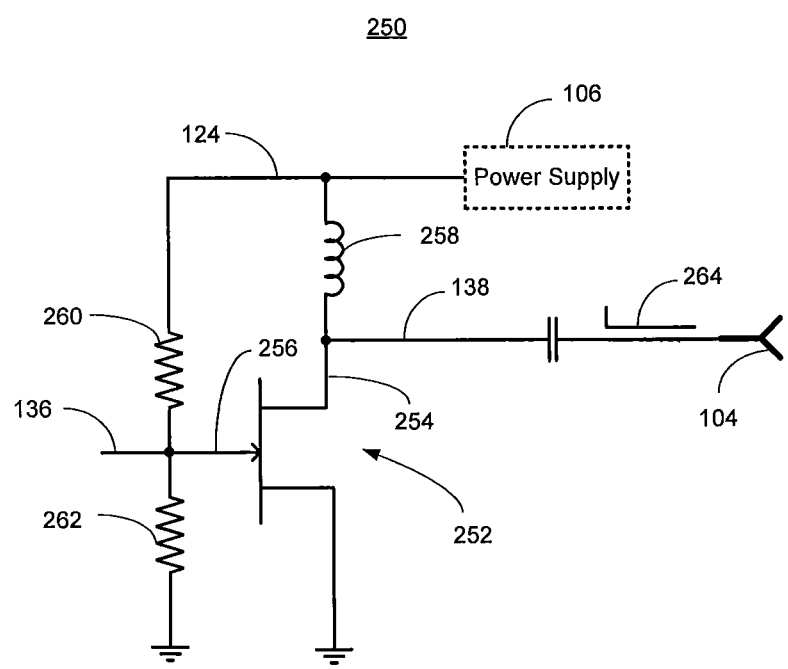
FIG. 6 is a schematic of a power amplifier in accordance with the current disclosure.
Figure 7:
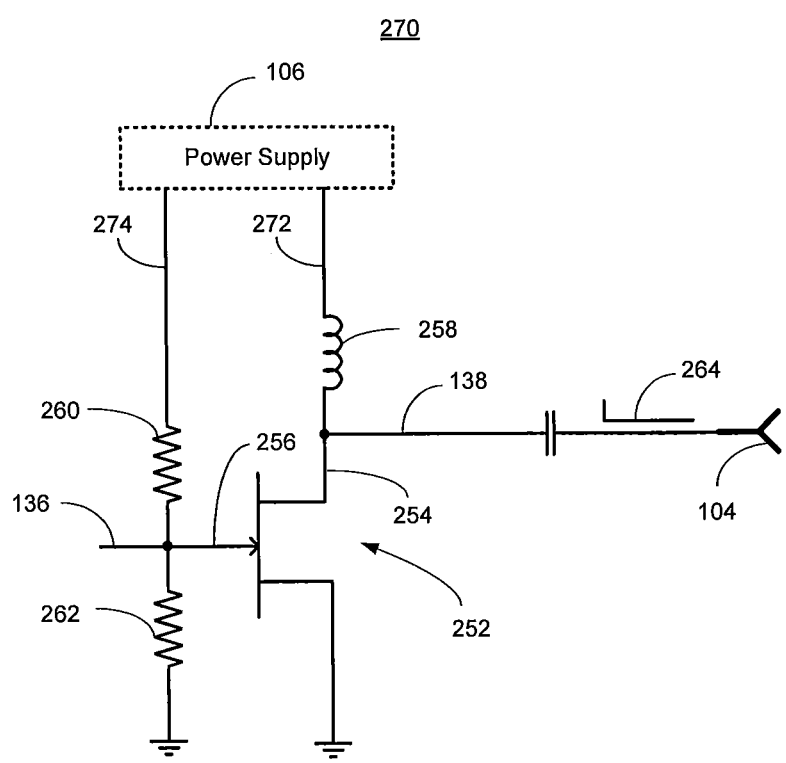
FIG. 7 is a schematic of another embodiment of a power amplifier in accordance with the current disclosure.

Referring to FIG. 6, an exemplary power amplifier circuit 250 that is the same as or similar to a PA 134a, 134b, 134c of FIG. 1 is illustrated. The output device 252 has a drain 254 and a gate 256. The drain 254 may be coupled to the antenna cell 104 via signal output 138 and the gate 256 may be coupled to the signal input 136. By controlling a gate voltage and a drain voltage of the power amplifier 250 a desired gain compression in the power amplifier 250 can be achieved. The impedance values of elements 258, 260, and 262 may be selected to provide the correct bias for operation. A coupler 264 may provide an additional measurement of power and phase for use in additional fine tuning compression level and phase of the PA 250. For example, FIG. 7 illustrates an alternate embodiment of a PA 270 similar to the PA 250 of FIG. 6. In this embodiment, the power supply 106, instead of a single power output 124 has dual power outputs 272 and 274 coupled, respectively, to the drain bias impedance 258 and the gate bias resistor 260. The PA 270 is then capable of independent adjustments to both phase and gain compression allowing further tuning of the radiation pattern and efficiency while still sharing the single pre-distortion linearizer 140 with other power amplifiers.

Figure 8:
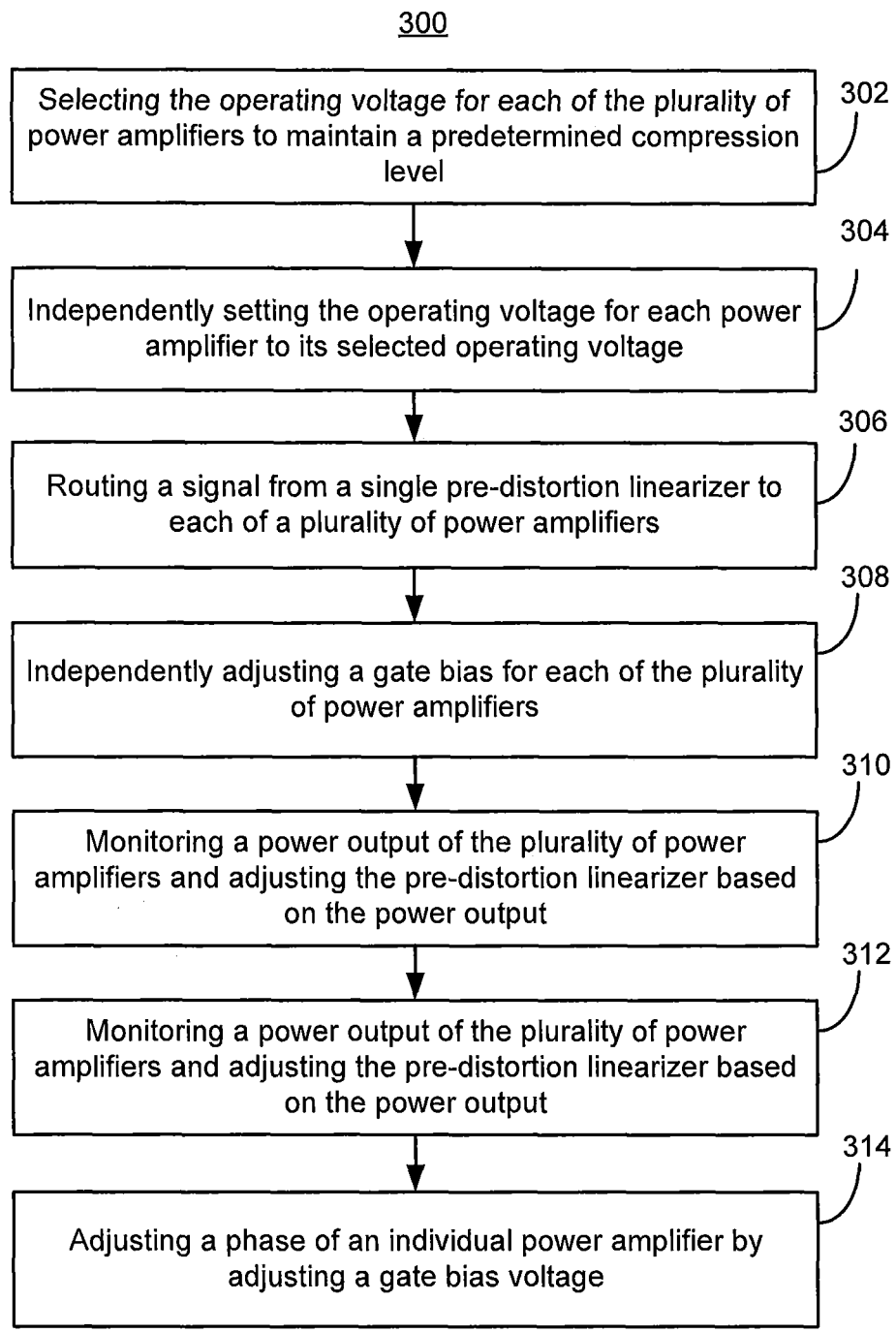
FIG. 8 is an illustration of operations performed by one embodiment of an antenna array in accordance with the current disclosure.

FIG. 8 is a flowchart 300 of a method for simultaneous linearization of a plurality of power amplifiers 134a, 134b, 134c with independently set operating voltages for antenna array 100. At block 302, a signal may be routed from a single pre-distortion linearizer 140 to each of the plurality of power amplifiers 134a, 134b, 134c. The operating voltage for each individual power amplifier 134a, 134b, 134c of the plurality of power amplifiers 134a, 134b, 134c may be set at block 304. The operating voltage for each individual power amplifier 134a, 134b, 134c is selected to maintain each of the plurality of power amplifiers 134a, 134b, 134c at a predetermined compression level. The predetermined compression level is selected to achieve a desired distortion corresponding to a linearization provided by the single pre-distortion linearizer 140.

At block 306, the operating voltage for each individual power amplifier 134a, 134b, 134c is then set at its respective selected operating voltage. That is, each power amplifier 134a, 134b, 134c is coupled to a power supply 106, 112, 118 that supplies power to only its respective PA 134a, 134b, 134c. Each power supply 106, 112, 118 is individually set to provide its respective PA 134a, 134b, 134c the operating voltage required to achieve the desired compression level, and as a result, the desired distortion.

In one embodiment, the method may also include, at block 308, independently adjusting a gate bias for each individual power amplifier to achieve a desired phase shift at each individual power amplifier. In another embodiment, at block 310, the output power of the plurality of power amplifiers may be monitored and the single pre-distortion linearizer may be adjusted in real time based on the output power of the plurality of power amplifiers 134a, 134b, 134c. At block 312 in yet another embodiment, a gain of the signal may be independently adjusted for each of the plurality of power amplifiers 134a, 134b, 134c. For example, the controller 204 may independently set the gain stages 128a, 128b, 128c based on, among other things, a desired radiation pattern of the antenna array 100. Similarly, as discussed above, the phase for each PA 134a, 134b, 134c may be set by adjusting a gate bias voltage at block 314.

The teachings disclosed herein allow reducing phased array antenna element electronics size and power. Individually adjusting the operating voltage of each PA 134a, 134b, 134c in an antenna array 100 ultimately results in a reduced parts count and a lower operating cost. Because a single pre-distortion linearizer 140 can be used across potentially thousands of PA assemblies 102, 108, 114, the corresponding individual pre-distortion linearizers of prior art embodiments are eliminated, saving both cost and preserving valuable space near the antenna cells. Lower operating costs are achieved because each PA is operated in gain compression where its efficiency is highest.

While only certain embodiments have been set forth, alternatives and modifications will be apparent from the above description to those skilled in the art. These and other alternatives are considered equivalents and within the spirit and scope of this disclosure and the appended claims.

What is claimed:
1. An antenna array comprising:
a plurality of antenna cells;
a plurality of power amplifiers, each having a signal input, a signal output individually and separately coupled to one of the plurality of antenna cells, and a power input;

a plurality of power supplies, each power supply individually and separately coupled to a corresponding one of the plurality of power amplifiers at a respective power input; and a single pre-distortion linearizer with a linearizer input that receives a signal and a linearizer output that is coupled to the signal input of each of the plurality of power amplifiers.

2. The antenna array of claim 1, wherein the pre-distortion linearizer is a digital pre-distortion linearizer.

3. The antenna array of claim 2, wherein the digital pre-distortion linearizer has a pre-distortion profile generated in real time based on a state of the plurality of power amplifiers.

4. The antenna array of claim 1, further comprising a plurality of a gain stages, one gain stage coupled between the linearizer output and respective one power amplifier input.

5. The antenna array of claim 1, further comprising a plurality of phase adjustment modules, one phase adjustment module coupled between the linearizer output and a respective one power amplifier input.

6. The antenna array of claim 1, further comprising setting a first power supply of the plurality of power supplies at a level that operates a first power amplifier of the plurality of power amplifiers in gain compression.

7. The antenna array of claim 6, wherein setting the first power supply at the level that operates the first power amplifier in gain compression comprises setting one of a gate voltage and a drain voltage of the first power amplifier to achieve a desired gain compression.

8. The antenna array of claim 7, wherein the first power amplifier has a known distortion at the desired gain compression, wherein the pre-distortion linearizer compensates for the known distortion.

9. The antenna array of claim 7, further comprising setting the gate voltage to adjust a phase of the first power amplifier.

10. The antenna array of claim 6, further comprising a power detector that monitors a power output of the antenna array to determine a compression level of a one of the plurality of power amplifiers, wherein a corresponding power supply adjusts the compression level of the one of the plurality of power amplifiers to a desired gain compression.

11. The antenna array of claim 1, wherein the pre-distortion linearizer is an analog pre-distortion linearizer.

12. A method for simultaneous linearization of a plurality of power amplifiers, each of the plurality of power amplifiers having independently set operating voltages for one of a plurality of antenna cells of an antenna array, the method comprising:

selecting an operating voltage for an individual power amplifier of the plurality of power amplifiers, the operating voltage for the individual power amplifier selected to maintain the individual power amplifier at a predetermined gain compression level;

independently of each other power amplifier, setting the operating voltage for the individual power amplifier of the plurality of power amplifiers at the selected operating voltage; and routing a signal from a single pre-distortion linearizer to the individual power amplifier, the individual power amplifier having a signal output individually and separately coupled to a corresponding antenna cell of the plurality of antenna cells.

13. The method of claim 12, further comprising:
independently adjusting a gate bias for the individual power amplifier to achieve a desired phase shift at the individual power amplifier.

14. The method of claim 12, wherein selecting the operating voltage for the individual power amplifier comprises selecting the predetermined compression level to achieve a desired distortion corresponding to a linearization provided by the single pre-distortion linearizer.

15. The method of claim 12, further comprising:
monitoring an output power of the plurality of power amplifiers; and
adjusting the single pre-distortion linearizer in real time based on the output power of the plurality of power amplifiers.

16. The method of claim 12, further comprising independently adjusting a gain of the signal for each of the plurality of power amplifiers.

17. The method of claim 12, further comprising independently adjusting a phase of the signal for each of the plurality of power amplifiers.

18. An antenna array comprising:
a first power amplifier of a plurality of power amplifiers, each of the plurality of power amplifiers having a signal input, a signal output, and a power input;
a first power supply of a plurality of power supplies, each of the plurality of power supplies having a power output coupled to a respective power input of one of the plurality of power amplifiers, wherein the power output of the first power supply is set to operate the first power amplifier at a predetermined gain compression;
a single pre-distortion linearizer with a linearizer input and a linearizer output, the linearizer output coupled to each respective signal input of each of the plurality of power amplifiers; and
a plurality of antenna cells, each of the plurality of antenna cells individually and separately coupled to a respective one signal output of each of the plurality of power amplifiers.

19. The antenna array of claim 18, further comprising a controller that dynamically adjusts the power output of the first power supply to maintain the first power amplifier at the predetermined gain compression as an output power of the first power amplifier is changed.

20. The antenna array of claim 18, further comprising a controller that dynamically adjusts the pre-distortion linearizer based on a state of the antenna array.

* * * * *